(12) United States Patent
Suzuki

(10) Patent No.: US 7,381,475 B2
(45) Date of Patent: Jun. 3, 2008

(54) TREATED COPPER FOIL AND CIRCUIT BOARD

(75) Inventor: Yuuji Suzuki, Tochigi (JP)

(73) Assignee: Furukawa Circuit Foil Co., Ltd., Nikko, Tochigi-ken (JP)

( * ) Notice: Subject to any disclaimer, the term of this patent is extended or adjusted under 35 U.S.C. 154(b) by 233 days.

(21) Appl. No.: 11/052,998

(22) Filed: Feb. 7, 2005

(65) Prior Publication Data

US 2005/0175826 A1 Aug. 11, 2005

(30) Foreign Application Priority Data

Feb. 6, 2004 (JP) ............................. 2004-031164

(51) Int. Cl.
*B32B 15/20* (2006.01)
(52) U.S. Cl. ...................... 428/553; 428/607; 428/675; 428/687
(58) Field of Classification Search ...................... None
See application file for complete search history.

(56) References Cited

U.S. PATENT DOCUMENTS

| | | | | |
|---|---|---|---|---|
| 2002/0182432 | A1* | 12/2002 | Sakamoto et al. | 428/553 |
| 2003/0093899 | A1* | 5/2003 | Sakamoto et al. | 29/846 |
| 2003/0148136 | A1* | 8/2003 | Yamamoto et al. | 428/607 |
| 2004/0157080 | A1* | 8/2004 | Shinozaki | 428/606 |
| 2004/0170857 | A1* | 9/2004 | Yoshihara et al. | 428/553 |
| 2006/0088723 | A1* | 4/2006 | Suzuki | 428/612 |
| 2007/0110969 | A1* | 5/2007 | Suzuki et al. | 428/209 |

FOREIGN PATENT DOCUMENTS

| | | |
|---|---|---|
| JP | 2000-233448 | 8/2000 |
| JP | 2001-049002 | 2/2001 |
| JP | 2003-064431 | 3/2003 |

* cited by examiner

*Primary Examiner*—John J Zimmerman
(74) *Attorney, Agent, or Firm*—Knobbe Martens Olson & Bear LLP

(57) ABSTRACT

An object of the present invention is to provide a treated copper foil laminated with a mesomorphic polymer film having low hygroscopicity and superior high thermal resistance to make a circuit board composite materials having large peel strength and compatibility with fine pattern processes, which a copper foil being deposited with roughening particles to make the treated copper foil having a roughening treated side with surface roughness of 1.5 to 4.0 μm and luminosity of not more than 30, having projections formed from the roughening particles with a height of 1 to 5 μm, preferably 6 to 35 thereof are uniformly distributed in a 25 μm of surface length of copper foil cross-section observed, and its maximum width being at least 0.01 μm and not more than twice of 25 μm divided by the number of projections in the 25 μm surface length.

14 Claims, 3 Drawing Sheets

TREATED COPPER FOIL AND CIRCUIT BOARD

BACKGROUND OF THE INVENTION

1. Field of the Invention

The present invention relates to a treated copper foil improved in peel strength with epoxy resin, polyimide resin, or thermoplastic mesomorphic polymer-based film (hereinafter called "mesomorphic polymer film"), more particularly relates to a treated copper foil laminated with such films for flexible board, high density mount multilayer board, or high frequency circuit board and to a circuit board formed by using the treated copper foil.

2. Description of the Related Art

The recent demand for increasing smaller size and lighter weight of electronic equipments have led to highly integrated electronic components. A composite circuit board for producing flexible board, high density mount multilayer board, high frequency circuit board, etc. used for the above components (hereinafter called "circuit board") consists of conductors (copper foil) and insulator boards to support the conductors. The insulator board secures electric insulation between the conductors and supplies strength for supporting electronic parts connected to the conductor.

The higher the speed of a signal transmit though circuit board, the more important the intrinsic impedance and signal transmission speed of the insulator material of the circuit board. Since these characteristics are closely related with the dielectric constant and dielectric loss of the insulator material, improvement of these properties is required.

As insulator materials for circuit board satisfying the above conditions, phenol resin materials are mainly used. As insulator materials for plating through holes, epoxy resin materials are mainly used. Further, recently, for high speed propagation of signals, insulator materials with smaller dielectric constants and smaller dielectric losses have been developed.

For circuit board requiring heat resistance, heat resistant epoxy resin, polyimide, and other insulator boards have been used. In addition, materials having good dimensional stability, materials resistive to warping or distortion, and materials having small heat shrinkage have been developed.

When flexible circuit board composite materials require heat resistance or solderability, polyimide films have been used. For applications involving printing using carbon ink and not using solder, polyester films are used. Recently, flexible boards have become more complicated and in many cases polyimide films have been favored.

However, dielectric property of polyimide changes greatly with absorption of moisture and also high frequency property drops greatly in humid environment. Further, while having a high heat resistance, it does not melt at high temperature. Therefore, in the case of composite material with copper foil conductor, it is necessary to cast the precursor polyamic acid on the copper foil, then imidize it or to provide a polyimide film with an adhesive layer, then laminate copper foil with it. As a result, the process becomes complicated.

Therefore, mesomorphic polymers have started to be looked at as thermoplastic materials with little change of the dielectric property due to their lower hydroscopicity compared with polyimides and having enough heat resistance to withstand soldering. However, copper film has a low peel strength with mesomorphic polymer compared with polyimide.

The copper foil used for the conductive layer laminated on insulator board is mainly electrodeposited copper foil. Electrodeposited copper foil is usually formed by an electroforming cell such as shown in FIG. 1 and is roughing treated for improving the peel strength or made stainproof by a treater such as shown in FIG. 2.

The electroforming cell shown in FIG. 1 has a rotating drum-shaped cathode 2 (surface formed by stainless steel or titanium) and an anode 1 (lead or precious metal oxide-covered titanium) arranged concentrically with the cathode. An electroplating solution 3 is circulated and current run between the electrodes to deposit a predetermined thickness of copper on the cathode surface. The copper is then peeled off from the cathode surface as a foil. At this stage, the copper foil 4 is an untreated copper foil. The surface of the untreated copper foil which contacted the electroplating solution forms a matte surface, while the surface which contacted the drum-shaped cathode 2 forms shiny side.

The untreated copper foil 4 produced has to be improved in peel strength with insulator board to produce good copper-clad laminate. Therefore, it is continuously treated electrochemically or chemically by the treater shown in FIG. 2. FIG. 2 shows the system for continuous electrochemical treatment. The untreated copper foil 4 is treated by running it through electroplating tanks filled with electroplating solutions 5 and 6 using electrodes 7 as anode and the copper foil as cathode so as to deposit granular copper on its surface and thereby improve the peel strength of copper foil with insulator board (resin). This process is the roughing treatment process. This roughing treatment is normally applied on the matte side or shiny side of the untreated copper foil 4. The copper foil after this treatment is the treated copper foil 8 which is laminated with insulator board to make circuit board.

Among epoxy resins, polyimide resins, and mesomorphic polymers, mesomorphic polymers are known to be poor in peel strength with copper foil. Generally, the peel strength of these resins with copper foil is greatly affected by the copper foil's surface roughness Rz defined by "5.1 Ten Point Roughness Average" of "Definitions and Indications of Surface Roughness" in JISB 0601-1994. When considering the surface roughness of copper foil, surface roughness Rz of both untreated and treated copper foil may be referred. When improving the peel strength of untreated copper foil with smooth surface, particularly for resin with which it has poor peel strength, the practice has been to increase the current running though it during the roughing treatment to increase the amount of granular copper deposition and increase the surface roughness Rz. It is true that this method is suitable for improving peel strength, but, for high frequency property, in terms of surface effect, it is not preferable to increase the surface roughness Rz and the amount of roughening particles.

Depending on the type of mesomorphic polymer resin, the increased surface roughness Rz dose not always improve the peel strength. It is known that this is closely related to the shape of projections formed by the roughening particles.

The higher density circuit patterns of printed circuit board is also in more demand. So-called "fine pattern" printed circuit boards are made with circuit patterns by fine lines and pitches. Recently, printed circuit boards formed by high density ultra-fine interconnects with line pitches of 50 to 100 μm and line widths of about 30 μm are required. Improving the peel strength by raising the surface roughness Rz by roughening particles or increasing the amount of deposition is not suitable when forming such fine patterns. It is also possible to roughen the surface of untreated copper foil and reduce the amount of deposition of roughening particles to improve the peel strength, but this is not suitable for obtaining a high frequency property and producing fine patterns.

As a copper foil improved in peel strength with mesomorphic polymer, Japanese Unexamined Patent Publication (Kokai) No. 2003-64431 proposes a copper alloy foil containing specified metal elements and provided with predetermined thicknesses of surface oxide layer and stainproof layer. However, when making mesomorphic polymer into a film, the rod-shaped molecules become oriented in the planar direction, so the material strength in thickness direction sharply drops. With non-roughened copper foil, the mesomorphic polymer film is easily destroyed at just underneath the boundary with copper foil, so the desired peel strength cannot be obtained.

In order to improve the peel strength of mesomorphic polymer, Japanese Unexamined Patent Publications (Kokai) No. 2001-49002 and No. 2000-233448 propose methods for treatment by plasma or UV rays. Even with such methods, however, not enough peel strength is obtained with copper foil having low surface roughness.

Therefore, the development of copper foil having good high frequency property, stability to fabricate fine patterns, and ability to improve peel strength is a crucial demand.

SUMMARY OF THE INVENTION

An object of the present invention is to provide treated copper foil able to form fine patterns and having high peel strength with general use epoxy resin, polyimide films and especially with mesomorphic polymers having remarkable low hygroscopicity leading to little change in dielectric properties, enough heat resistance to withstand soldering, and ability to be heat laminated with copper foil despite its low peel strength, and also a circuit board with better high frequency property using the treated copper foil.

To achieve the first object, according to the first aspect of the invention, provided is a treated copper foil comprising a copper foil on at least one side of which roughening particles are deposited to make a roughening treated surface having a surface roughness of 1.5 to 4.0 µm and luminosity of not more than 30.

Preferably, the treated copper foil is a treated copper foil comprising an untreated copper foil on at least one side of which the amount of roughening particles of copper or copper alloy deposited is 2.5 to 400 mg/dm$^2$.

Preferably, the height of projections formed by the roughening particles is 1 to 5 µm and 200 to 25000 of the projections are distributed in its 100 µm×100 µm area.

Preferably, the height of projections formed by the roughening particles is 1 to 5 µm and 6 to 35 of the projections are distributed uniformly in a 25 µm surface of copper foil cross-section observed.

Preferably, the maximum width of projections is at least 0.01 µm and not more than twice of 25 µm length divided by the number of projections in the 25 µm surface length.

Preferably, the untreated copper foil before roughening treatment is an electrodeposited copper foil.

More preferably, the surface to be roughening treated of the untreated copper foil is a matte side with surface roughness Rz of not more than 2 µm.

More preferably, the electrodeposited copper foil of surface treated foil comprises granular crystals.

More preferably, the surface to be roughening treated of the untreated copper foil is a matte side with surface roughness Rz of not more than 2 µm.

Preferably, the surface roughness Rz of at least a one side of foil surface to be roughening treated of the untreated copper foil before roughening treatment is not more than 2 µm.

Preferably, the projections formed of the roughening particles are formed of Cu particles or Cu and Mo alloy particles or alloy particles of Cu and at least one element selected from a group of Ni, Co, Fe, Cr, V, and W.

Preferably, the surface formed with projections by the roughening particles is coated with a film of Ni or Ni alloy.

Preferably, the surface formed with projections by the roughening particles is coated with a stainproof layer of Zn or Zn alloy and/or Cr metal or chromate.

Preferably, the silane coupling layer is coated on the surface formed with projections by the roughening particles and/or on top of the stainproof layer.

According to the second aspect of the present invention, there is provided a circuit board formed by using the treated copper foil above.

BRIEF DESCRIPTION OF THE DRAWINGS

These objects and features of the present invention will be described in more detail with reference to the accompanying drawings, in which.

DESCRIPTION OF THE PREFERRED EMBODIMENTS

Figure 1:
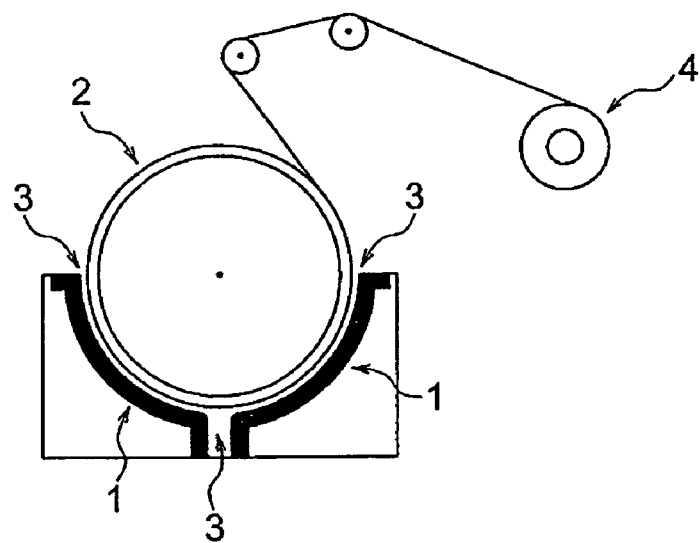
FIG. 1 is a sectional view of the structure of electroforming cell.

Next, preferred embodiments of the present invention will be explained with reference to the drawings.

In the present invention, a pre-treatment copper foil (untreated copper foil) is formed by electroplating or rolling. The untreated copper foil is preferably copper or copper alloy foil having thickness of 1 to 200 µm and surface roughness Rz of 0.01 to 2 µm at least on one side of surface. With copper foil under 1 µm thick, it is difficult to treat the surface. For a high frequency printed circuit board, copper foil over 200 µm thick is not realistic.

Concerning the surface roughness of untreated copper foil, foil with surface roughness of less than 0.01 µm is difficult to produce in practice. Even if it can be produced, the production cost would be high and this is impractical. Further, it is possible to use untreated copper foil with Rz of over 2.0 µm, but if considering the high frequency property and availability of fine patterns, the surface roughness of untreated copper foil is more preferably not more than 2 µm.

In the present invention, the above untreated copper foil is treated. The surface of untreated copper foil will have roughening particles deposited on it by roughening treatment to make the surface roughness Rz 1.5 to 4.0 µm.

The surface of untreated copper foil is treated to deposit roughening particles to form projections and make the surface roughness Rz 1.5 to 4.0 µm on the roughened side.

When the surface profile Rz is under 1.5 μm, the peel strength becomes weak and the treated copper foil is not satisfactory for use. If the Rz is over 4.0 μm, the high frequency property is degraded and it is also not suitable for fine patterning. The amount of copper or copper alloy deposited on untreated copper foil by roughening treatment in the present embodiment is preferably 2 to 400 mg/dm². With the amount of deposition under 2 mg/dm², the peel strength becomes weak, so the treated copper foil is not satisfactory for use. If it is larger than 400 mg/dm², the high frequency property is degraded and further the foil is not suitable for fine patterning.

The treated copper foil of the present embodiment must have a luminosity of not more than 30. The luminosity in the present embodiment is used as an index of the surface roughness and is defined as the luminosity obtained by irradiating sample surface with a certain amount of light and compared with the measured amount of reflected light. When the treated side of copper foil is measured for luminosity by the above method, large surface roughness Rz or deep trenches between roughening projections reflect less light giving low luminosity. On smooth surface, the light reflects more and luminosity goes high. To improve the peel strength with insulation board of mesomorphic polymer film, the luminosity should be not more than 30. With luminosity of over 31, even if the roughened surface has large Rz, the relief shapes are flatter and the treated copper foil will not fit well with the insulator board of the mesomorphic polymer film and the peel strength will not be improved.

Note that the luminosity explained here was measured by a luminosity meter (SM color computer, Model Number SM-4, made by Suga Test Instrument) for copper foil after stainproofed in the range of:

Ni: 0.01 to 0.5 mg/dm²
Zn: 0.01 to 0.5 mg/dm²
Cr: 0.01 to 0.3 mg/dm²

The treated copper foil in the present invention having the above surface roughness Rz and luminosity can be laminated and joined with mesomorphic polymer film despite the defect of poor bondability of mesomorpher polymer film so as to, as clear from the following example and comparative example, provide copper-clad laminates having superior peel strength and fine patternability.

In the present invention, as explained above, the untreated copper foil is roughening treated on its surface. In order to improve peel strength and fine patternability, the projections formed by the roughening particles are preferably distributed substantially uniformly. The height of the projections is preferably 1.0 to 5.0 μm. If height of the projections formed on the surface of untreated copper foil is under 1.0 μm, it will not improve the peel strength sufficiently. If over 5.0 μm, the distribution of the projections will not be uniform giving varied surface roughness Rz by region resulting in unstable peel strength and drop of the high frequency property, and it will not be suitable for fine patterning. Note that the "height" is defined as the distance between the base surface of untreated copper foil and the top of projection.

If the number of projections decreases, the peel strength will not be secured. Conversely, if there are too many projections, the bond strength between the copper foil surface and the projections will become weak and the effect of the projections will decrease by contraries. In the present invention, as explained above, the number of projections formed by treating the surface of untreated copper foil with roughening particles for obtaining uniform peel strength is preferably 200 to 25000 in its 100 μm×100 μm area. If the number of the projections is under 200, the distance between the projections will become too wide and fine patterns will not be utilized. If over 25000, the distance between the projections will become too narrow and the peel strength will be lowered.

In the present invention, the number of the projections is preferably 6 to 35 in the 25 μm surface length in the observed cross-section, more preferably 10 to 20.

Here, the concept of the projections in the observed cross-section is explained. If the distance from the bottom of a trench formed between one projection and another adjoining projection to the top of lower projection (hereinafter called as the "trench depth") is less than 0.3 μm, that adjacent projection is included with that projection and the two considered as one projection. If the trench depth is over 0.3 μm, the adjacent projection is considered as an independent projection and the two deemed as two projections. Note that while the height of a projection is defined as the distance between the surface of the untreated copper foil and the top of the projection, the trench depth is the distance between the bottom of a trench and the top of a projection after treatment.

As the method for counting the number of projections, the copper foil is capsulated dip in resin, polished, then observed at its cross-section by SEM. Count the number of projections in 25 μm surface length by a micrograph as defined above. The numbers of projections measured by this method in the present invention are given in the table of the examples. Schematic views as seen in cross-section are given in FIGS. 3, 4, and 5.

As seen there, there are 6 to 35 projections having heights of 1.0 to 5.0 μm in the 25 μm length area. These are uniformly distributed with trenches of over 0.3 μm between the projections. As a result, the projections are not localizing concentrating in the 25 μm area, so the peel strength can be maintained stable throughout the width and length direction of the copper foil.

Note that "uniformly distributed" as used in the present invention is defined as meaning "there is at least part of one projection in an area of 25/n μm width where "n" being the number of projections having 1.0 to 5.0 μm height between the top of the projections and the copper foil surface and 25 μm being the surface length for observing cross-section of the projections.

In order to stabilize the peel strength, preferably the projections formed have uniform width. Preferably, the maximum width of the projections is at least 0.01 μm and not more than twice of the 25 μm length divided by the number of the projections in the 25 μm area. The "maximum width" used here means the maximum value of the distance in a direction perpendicular to the height direction of the projections in the above SEM observation of the cross-section.

The average of the trench depths between the projections is more preferably at least 0.5 μm.

The average of the trench depths between the projections is found by the following formula when measuring the trench depths of both sides of n unit projections having trench depths of at least 0.3 μm and designating these values as A1 (μm), B1 (μm), . . . , An (μm), and Bn (μm):

$$((A1+B1)+\ldots+(An+Bn))/2/n$$

Figure 3:
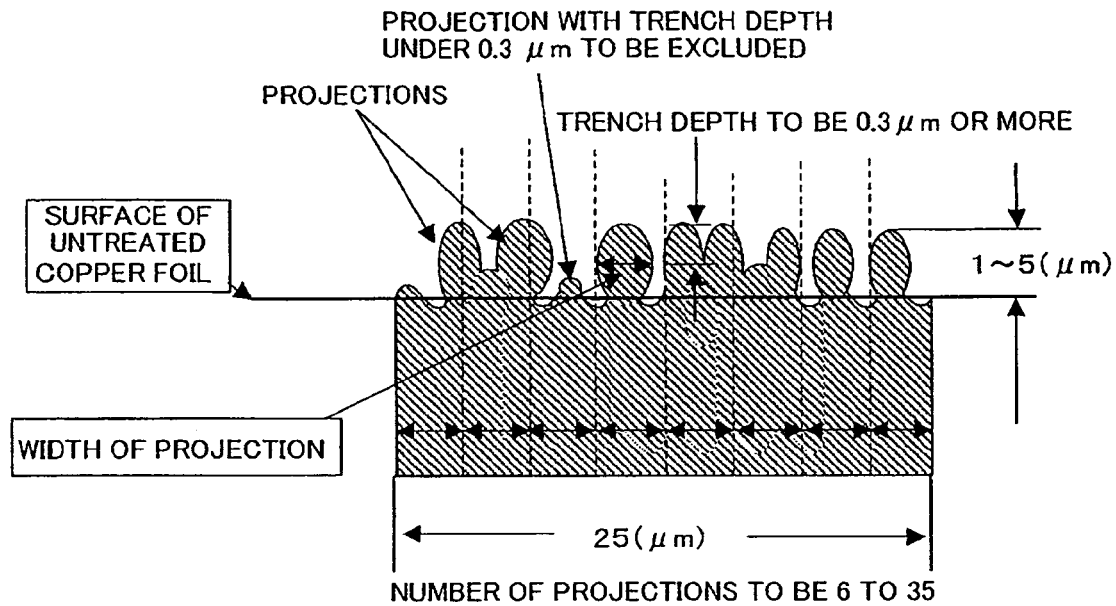
FIG. 3 is a sectional schematic view of treated copper foil according to an embodiment of the present invention.

FIG. 3 is a view of the observed cross-section of treated copper foil meeting with the requirements of the present invention. There are at least six projections in the 25 μm area, the heights thereof are within 1 to 5 μm, and the trench depths are at least 0.3 μm. The maximum width of the projections is at least 0.01 μm and not more than twice of the 25 μm length divided by the number of projections in the 25 μm area.

Figure 4:
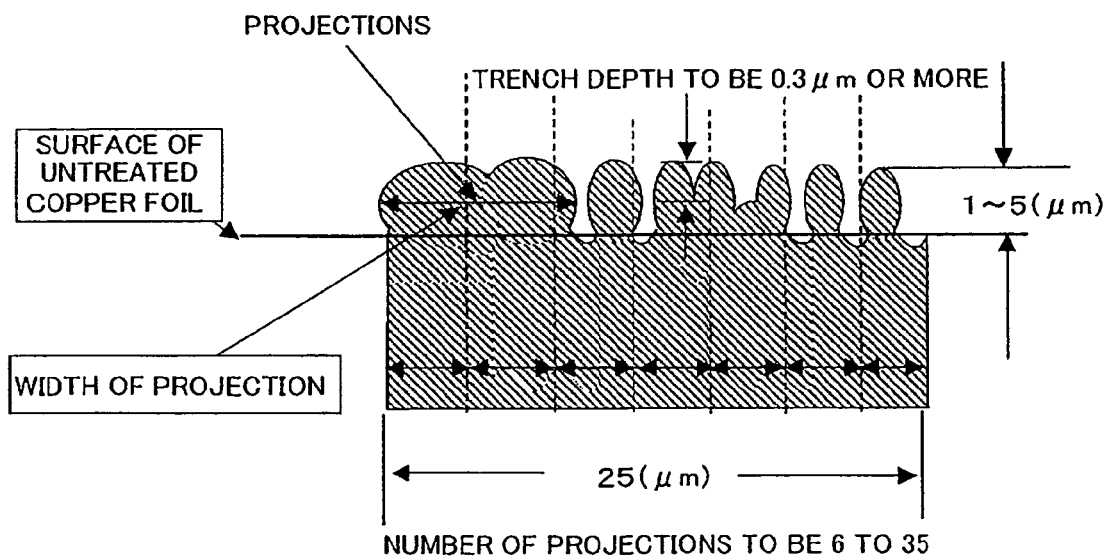
FIG. 4 is a sectional schematic view of treated copper foil according to another embodiment of the present invention.
Figure 5:
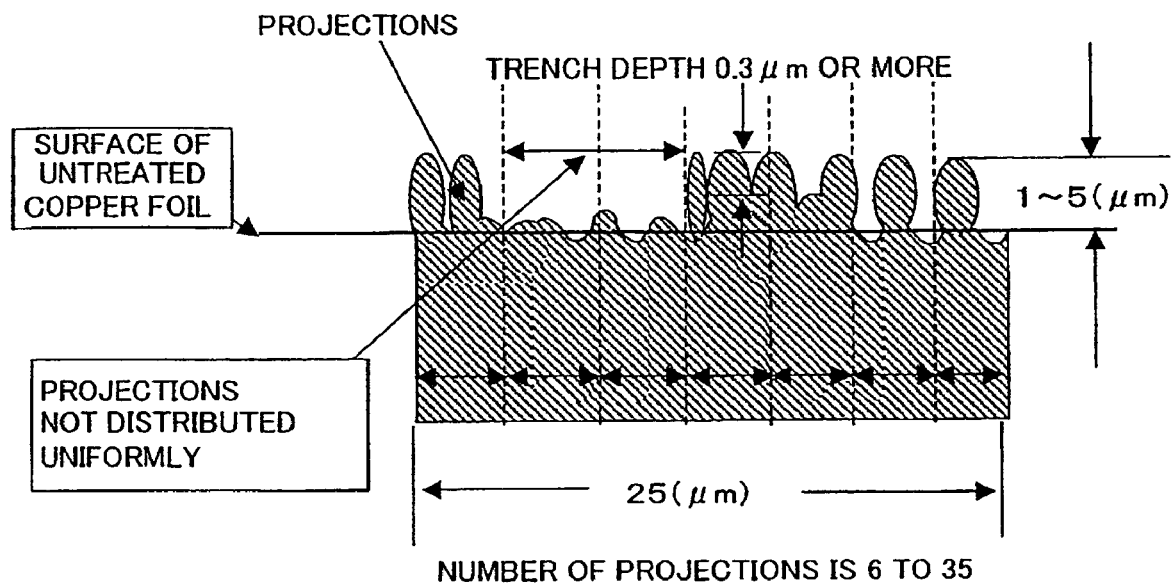
FIG. 5 is a sectional schematic view of a state where projections of treated copper foil are not distributed uniformly.
Figure 6:
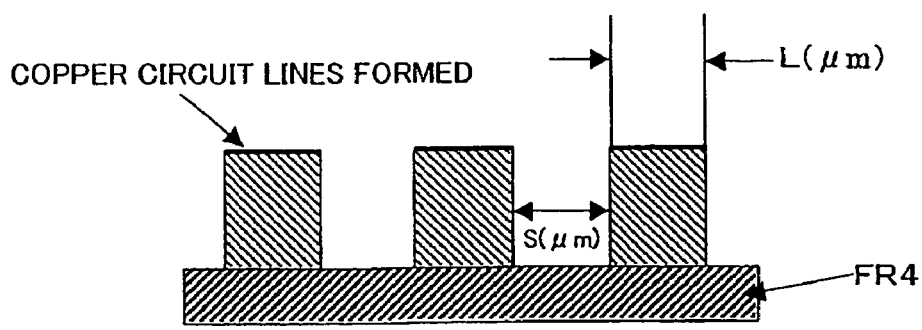
FIG. 6 is a cross-section view of circuit board after etching.

FIG. 4 shows a cross-section of the projections where the maximum width is at least 0.01 μm and not more than twice of the 25 μm length divided by the number of the projections in the 25 μm area. FIG. 5 shows a cross-section where the projections are not distributed uniformly.

The treated copper foil having the cross-sectional shape shown in FIG. 3 has a good peel strength with a mesomorphic polymer film and can form fine circuit patterns. The treated copper foil having the cross-sectional shape shown in FIG. 4 has some projections with wide width, so there are parts where the peel strength to the mesomorphic polymer film is weak and formation of fine circuit patterns may be obstructed, but this does not hinder use for general applications. As shown in FIG. 5, however, when the projections are not uniformly distributed, problems occurs in the peel strength to the mesomorphic polymer film and fine circuit patterns cannot be formed.

The roughening particles forming the projections at the treated copper foil in the present invention include Cu or Cu and Mo alloy particles or particles of Cu and at least one element from the group of Ni, Co, Fe, Cr, V, and W.

While the desired projections may be obtained by Cu particles or Cu and Mo alloy particles, it is more effective that the projections be formed by two or more types of alloy roughening particles formed by Cu particles or Cu and Mo alloy particles including at least one further element selected from the group of Ni, Co, Fe, Cr, V, and W so as to form more uniform particles. The roughening particles formed with these projections are chemically bonded with the resin, so may be considered to improve the peel strength. While depending on the type of resin, as particles improving the peel strength due to chemical bonding, Cu—Mo alloy, Cu—Ni alloy, Cu—Co alloy, Cu—Fe alloy, Cu—Cr alloy, Cu—Mo—Ni alloy, Cu—Mo—Cr alloy, Cu—Mo—Co alloy, Cu—Mo—Fe alloy may be mentioned.

At least one further element selected from the group of Mo, Ni, Co, Fe, Cr, V, and W included in the alloy particles for forming the projections is preferably contained in an amount of 0.01 ppm to 20% with respect to the Cu content. If the content is over 20%, the alloy will be difficult to melt when etching the circuit patterns in later step. More preferably, for obtaining uniform projections, it is desirable to optimize the current density, bath temperature, and treatment time for the electroplating solution.

The surface formed with the projections may be provided with at least one plating layer of a metal selected from the group of Ni, Ni alloy, Zn, Zn alloy, and Ag for improving resistance to particle shedding, resistance to hydrochloric acid, heat resistance, and electrical conductivity. In addition, the other surface free from the projections may be plated with at least one layer of Ni, Ni alloy, Zn, Zn alloy, or Ag for improving the resistance to particle shedding, resistance to hydrochloric acid, heat resistance, and electric conductivity. In order to improve these characteristics, the amount of the deposited metal is desirably 0.05 to 10 mg/dm$^2$.

In particular, with a mesomorphic polymer resin, Ni or a Ni alloy is effective for increasing the peel strength.

The treated side of the foil of above structure is formed with a Cr and/or chromate coating layer and, according with need, is treated with a silane coupling agent or made stainproof and treated with a silane coupling agent.

For insulator board, epoxy resin film, polyimide film, film composition containing at least 50% of the mesomorphic polymer, etc. may be used. To control the coefficient of linear expansion and improve the bondability and physical properties, the resin with composition containing the mesomorphic polymer may be further mixed with an inorganic filler or polyether sulfone, polyamide imide, polyether imide, polyether ether ketone, thermoplastic polyimide, or another thermoplastic resin. However, if the content of the mesomorphic polymer is less than 50%, the low hygroscopicity, heat resistance, dielectric property, and other properties of the mesomorphic polymer will be lost.

The "composition containing at least 50% of mesomorphic polymer" as used here (hereinafter simply called "mesomorphic polymer") indicates a thermoplastic mesomorphic polymer having mesomorphism in heat melted state. It does not indicate a lyotropic-type mesomorphic polymer such as aromatic polyamide having mesomorphism in solution, but not melting when heated. As typical examples of mesomorphic polymers, aromatic hydroxycarboxylic acids, aromatic dicarboxylic acids, aromatic diols, in monomers alone or their copolymer namely all aromatic polyesters may be mentioned.

As the methods for laminating the mesomorphic polymer of the insulator board and the roughened copper foil, hot pressing, continuous rolling method, continuous belt pressing, etc. may be used. No adhesive etc. is used for the hot bonding.

EXAMPLES

Below, the present invention will be explained in detail with reference to specific examples, but the present invention is not limited to these examples.

In these examples, the following copper foils, treatment plating solutions, and insulation board films were used.

Copper Foils

Original Copper Foil 1: Untreated electrodeposited and rolled copper foil with thicknesses of 12 μm, matte side roughnesses Rz of 1.26 μm, and shiny side roughnesses Rz of 1.82 μm were prepared.

Original Copper Foil 2: Untreated electrodeposited and rolled copper foil with thicknesses of 12 μm, matte side roughnesses Rz of 1.52 μm, and shiny side roughnesses Rz of 1.46 μm were prepared.

Original Copper Foil 3: Untreated electrodeposited and rolled copper foil with thicknesses of 12 μm, matte side roughnesses Rz of 1.86 μm, and shiny side roughnesses Rz of 1.2 μm were prepared.

Treatment Plating Solutions and Plating Conditions
Electroplating A
Plating Bath 1
Copper sulfate as Cu metal: 5 to 10 g/dm$^3$
Sulfuric acid: 30 to 120 g/dm$^3$
Ammonium molybdate as Mo metal: 0.1 to 5.0 g/dm$^3$
Current density: 10 to 60 A/dm$^3$
Time: 1 sec to 2 min
Bath temperature: 20 to 60° C.
Plating Bath 2
Copper sulfate as Cu metal: 20 to 70 g/dm$^3$
Sulfuric acid: 30 to 120 g/dm$^3$
Current density: 5 to 60 A/dm$^3$
Time: 1 sec to 2 min
Bath temperature: 20 to 65° C.
Electroplating B
Plating Bath 1
Copper sulfate as Cu metal: 1 to 50 g/dm$^3$
Nickel sulfate as Ni metal: 2 to 25 g/dm$^3$
Ammonium metavanadate as V metal: 0.1 to 15 g/dm$^3$
pH: 1.0 to 4.5

Current density: 1 to 60 A/dm³
Time: 1 sea to 2 min
Bath temperature: 20 to 60° C.
Plating Bath 2
Copper sulfate as Cu metal: 10 to 70 g/dm³
Sulfuric acid: 30 to 120 g/dm³
Current density: 5 to 60 A/dm³
Time: 1 sea to 2 min
Bath temperature: 20 to 65° C.
Electroplating C
Plating Bath 1
Copper sulfate as Cu metal: 1 to 50 g/dm³
Cobalt sulfate as Co metal: 1 to 50 g/dm³
Ammonium molybdate as Mo metal: 0.1 to 10 g/dm³
pH: 0.5 to 4.0
Current density: 1 to 60 A/dm³
Time: 1 sec to 2 min
Bath temperature: 20 to 60° C.
Plating Bath 2
Copper sulfate as Cu metal: 10 to 70 g/dm³
Sulfuric acid: 30 to 120 g/dm³
Current density: 5 to 60 A/dm³
Time: 1 sec to 2 min
Bath temperature: 20 to 65° C.
Electroplating A' and B'
Plating Bath 3
Copper sulfate as Cu metal: 20 to 70 g/dm³
Sulfuric acid: 30 to 120 g/dm³
Current density: 3 A/dm³
Time: Over 2 min (variable with surface roughness)
Bath temperature: 15° C.
Insulator Board Film Mesomorphic Polymer Film (Insulator Board) 1 (hereinafter called the "Film 1"): Type-I mesomorphic polymer film BIAC-BA050F-NT made by JAPAN GORE-TEX was used.

Mesomorphic Polymer Film (Insulator Board) 2 (hereinafter called the "Film 2"): Type-II mesomorphic polymer film BIAC-BA050F-NT made by JAPAN GORE-TEX was used.

Figure 2:
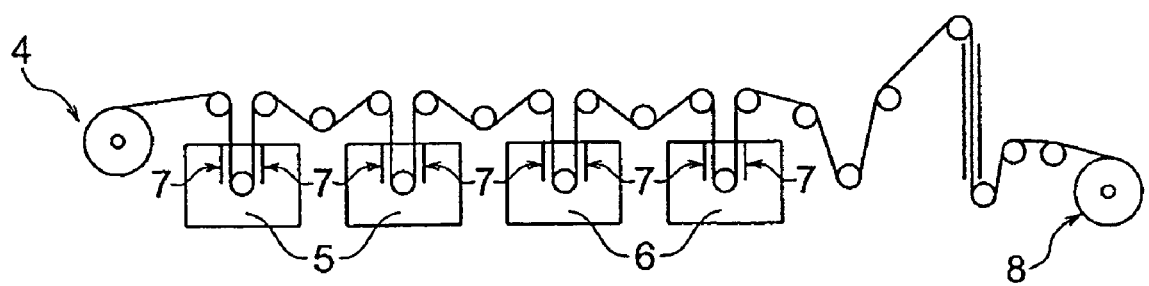
FIG. 2 is a sectional view of the structure of treater.

The original copper foils 1, 2 and 3 were plated at the treater shown in FIG. 2 in the order of Plating Bath 1 and then 2 using the plating solutions, bath temperatures, and current conditions shown in Electroplatings A, B and C at least once. The roughened sides were then plated with Ni (0.3 mg/dm³) and zinc (0.1 mg/dm³) and then treated with chromate. Note that, in the case of the Electroplatings A' and B', instead of the Plating Bath 2, the solution and conditions of the Plating Bath 3 were used to prepare foils for comparative examples.

The obtained treated copper foils were measured for surface roughness etc. The results are shown in Table 1 along with the selected treatment conditions.

Next, the obtained treated copper foils were laminated with the mesomorphic polymer films (insulation boards).

That is, the treated copper foils were laid over the Film 1 or 2, then were pressed by a multistep vacuum press system (Hot and Cold Press VH3-1377 made by Kitagawa Works) for 5 minutes each at 335° C. and 4 MPa for the Film 1 and at 310° C. and 4 MPa for the Film 2, then cooled to obtain composite board materials. The temperature was raised from room temperature at a rate of 7° C./min.

Further, instead of mesomorphic polymer films, polyimide films or epoxy resin sheets were used for lamination with the treated copper foil to obtain composite board materials.

In the case of polyimide film, the treated copper foil was cut to 250 mm×250 mm size, then polyimide sheet with thickness of 50 μm (UPILEX-VT made by Ube Industry) was placed on the roughened side. They were sandwiched between two flat stainless steel plates, then hot bonded at 330° C. with pressure of 2 kg/cm² over 10 minutes, then hot bonded at 330° C. with pressure of 50 kg/cm² over 5 minutes by 20 Torr vacuum press.

In the case of epoxy resin sheets, the treated copper foil was cut to 250 mm×250 mm size, placed with the roughened side down on glass fiber prepreg sheet (FR-4) designed to give 1 mm thickness after hot pressing. They were sandwiched between two flat stainless steel plates, then hot bonded at 170° C. with pressure of 50 kg/cm² over 60 minutes to prepare FR-4 carrier peel single-side copper-clad laminates with carrier foils.

The obtained composite board materials formed by the treated copper foils and mesomorphic polymer films, polyimide films, and epoxy resin sheets were measured for peel strength. The peel strength was measured by peeling in the copper foil 180 degree direction according to JIS C6471.

The composite board materials obtained here were also evaluated for fine patternability by the following method.

That is, the formed copper foils were laminated on FR-4 resin, covered with resist patterns of line widths L and space widths S, and etched by iron chloride bath. The etching time was determined so as to give top widths of the line widths L close to the resist widths. Ten such boards formed with resist patterns of line widths L and space widths S (each having 10 lines formed on the board) were formed for each of the types of copper foils and etched in iron chloride bath for the respectively determined times. The boards were then examined for bridges between the lines, residual bottom parts, and difference of the top width of the lines from the resist patterns. The smallest L and S values among the 10 boards without of these defects were obtained.

Table 1 shows the peel strengths and the fine patternability of the examples and comparative examples.

TABLE 1

| Sample | Type of copper foil | Treated side | Electroplating | Original foil | Treated side profile (μm) | Aver. trench depth bet. projections (μm) | Max. width of projections (μm) |
|---|---|---|---|---|---|---|---|
| Ex. 1 | ED (electro-deposited) | M | A | 1 | 2.5 | 1.05 | 1.81 |
| Ex. 2 | ED | S | B | 3 | 3.65 | 0.95 | 1.42 |
| Ex. 3 | Rolled | — | B | 1 | 2.65 | 0.89 | 2.4 |
| Ex. 4 | ED | M | B | 2 | 2.85 | 1.37 | 1.52 |
| Ex. 5 | ED | M | A | 3 | 3.15 | 1.64 | 1.43 |
| Ex. 6 | Rolled | — | C | 1 | 2.55 | 1.92 | 1.22 |

TABLE 1-continued

| Sample | | | | | | | |
|---|---|---|---|---|---|---|---|
| Ex. 7 | ED | M | B | 2 | 2.8 | 1.18 | 1.14 |
| Ex. 8 | ED | S | A | 3 | 2.55 | 0.55 | 2.63 |
| Ex. 9 | ED | M | A | 1 | 2.5 | 1.05 | 1.81 |
| Ex. 10 | ED | S | B | 3 | 3.65 | 0.95 | 1.42 |
| Ex. 11 | ED | S | A | 1 | 3.0 | 0.5 | 2.5 |
| Ex. 12 | ED | M | A | 1 | 2.5 | 1.05 | 1.81 |
| Ex. 13 | ED | S | B | 3 | 3.65 | 0.95 | 1.42 |
| Ex. 14 | ED | M | A | 1 | 2.5 | 1.05 | 1.81 |
| Ex. 15 | ED | S | B | 3 | 3.65 | 0.95 | 1.42 |
| Comp. Ex. 1 | ED | M | A' | 1 | 2.5 | <0.3 | <0.1 |
| Comp. Ex. 2 | ED | S | B' | 3 | 3.65 | <0.3 | <0.3 |
| Comp. Ex. 3 | Rolled | — | B' | 1 | 2.65 | <0.3 | <0.1 |
| Comp. Ex. 4 | ED | M | A' | 1 | 2.5 | <0.3 | <0.1 |
| Comp. Ex. 5 | ED | S | B' | 3 | 3.65 | <0.3 | <0.3 |
| Comp. Ex. 6 | ED | M | A' | 1 | 2.5 | <0.3 | <0.1 |
| Comp. Ex. 7 | ED | S | B' | 3 | 3.65 | <0.3 | <0.3 |
| Comp. Ex. 8 | ED | M | A' | 1 | 2.5 | <0.3 | <0.1 |
| Comp. Ex. 9 | ED | S | B' | 3 | 3.65 | <0.3 | <0.3 |
| Comp. Ex. 10 | ED | M | A' | 1 | 1.7 | <0.3 | <0.1 |
| Comp. Ex. 11 | ED | M | A' | 1 | 6.8 | <0.3 | 1.4 |

| Sample | No. of projections in unit area 100 μm × 100 μm | No. of projections in 25 μm area | Luminosity | Silane coupling | Film type | Peel strength (KN/m) | Fine pattern property min. L/S (μm/μm) |
|---|---|---|---|---|---|---|---|
| Ex. 1 | 8500 | 24 | 22.5 | N | Film 1 | 0.61 | 25/25 |
| Ex. 2 | 7000 | 22 | 23 | Y | Film 1 | 0.75 | 50/50 |
| Ex. 3 | 4890 | 18 | 23 | Y | Film 1 | 0.64 | 25/25 |
| Ex. 4 | 11160 | 28 | 21 | Y | Film 1 | 0.68 | 30/30 |
| Ex. 5 | 15650 | 31 | 19 | N | Film 1 | 0.72 | 40/40 |
| Ex. 6 | 16500 | 34 | 16 | Y | Film 1 | 0.73 | 25/25 |
| Ex. 7 | 9050 | 26 | 22 | Y | Film 1 | 0.62 | 30/30 |
| Ex. 8 | 2560 | 13 | 25 | Y | Film 1 | 0.57 | 25/25 |
| Ex. 9 | 8750 | 24 | 22.5 | N | Film 2 | 0.76 | 25/25 |
| Ex. 10 | 7500 | 22 | 23 | Y | Film 2 | 0.85 | 50/50 |
| Ex. 11 | 320 | 5 | 24 | Y | Film 2 | 0.55 | 25/25 |
| Ex. 12 | 8560 | 24 | 22.5 | Y | Polyimide | 0.75 | 25/25 |
| Ex. 13 | 7350 | 22 | 23 | Y | Polyimide | 1.04 | 50/50 |
| Ex. 14 | 8900 | 24 | 22.5 | Y | FR4 | 1.04 | 25/25 |
| Ex. 15 | 7430 | 22 | 23 | Y | FR4 | 1.31 | 50/50 |
| Comp. Ex. 1 | 0 | 0 | 38 | Y | Film 1 | 0.31 | 30/30 |
| Comp. Ex. 2 | 0 | 0 | 34 | Y | Film 1 | 0.36 | 55/55 |
| Comp. Ex. 3 | 0 | 0 | 39 | Y | Film 1 | 0.28 | 30/30 |
| Comp. Ex. 4 | 0 | 0 | 38 | Y | Film 2 | 0.42 | 30/30 |
| Comp. Ex. 5 | 0 | 0 | 34 | Y | Film 2 | 0.47 | 55/55 |
| Comp. Ex. 6 | 0 | 0 | 38 | Y | Polyimide | 0.56 | 30/30 |
| Comp. Ex. 7 | 0 | 0 | 34 | Y | Polyimide | 0.78 | 55/55 |
| Comp. Ex. 8 | 0 | 0 | 38 | Y | FR4 | 0.82 | 30/30 |
| Comp. Ex. 9 | 0 | 0 | 34 | Y | FR4 | 0.97 | 55/55 |
| Comp. Ex. 10 | 0 | 0 | 38 | Y | Film 2 | 0.25 | 20/20 |
| Comp. Ex. 11 | 1900 | 12 | 26 | Y | Film 2 | 0.78 | 125/125 |

As clear from Table 1, while the treated copper foils of examples and comparative examples were similar in surface roughness, they clearly differed in peel strength according to the number of the projections formed by the roughening particles and the resultant luminosity. It was learned that the peel strength of the treated copper foils of the examples were improved. Comparative Example 7 showed improvement in the peel strength due to the roughness, but had the defect of not being able to form fine patterns.

Summarizing the effects of the invention, the invention provides a treated copper foil formed with projections having predetermined shapes and distribution made by roughening particles on the surface. The treated copper foil has large peel strength with respect to insulator boards made of epoxy resins and polyimide films and mesomorphic polymers which has extremely low hygroscopicity leading to little variation in dielectric properties and have enough heat resistance to withstand soldering. The treated copper foil can also be finely patterned. Further, the present invention provides a circuit board using the treated copper foil and having superior high frequency properties with fine patterns.

The treated copper foil and circuit boards by the present invention can be particularly advantageously used in the field of electronic circuit components.

While the invention has been described with reference to specific embodiments chosen for purpose of illustration, it should be apparent that numerous modifications could be made thereto by those skilled in the art without departing from the basic concept and scope of the invention.

What is claimed is:

1. A treated copper foil comprising
   a copper foil on at least one side of which roughening particles are deposited to make a roughening treated surface, said roughening treated surface having a surface roughness Rz of 1.5 to 4.0 μm and luminosity of not more than 30, wherein a height of projections formed of said roughening particles is 1 to 5 μm and 200 to 25000 of said projections are distributed in a 100 μm×100 μm area, and a surface formed with projections formed from said roughening particles is formed with a stainproof layer in the ranges of Ni: 0.01 to 0.5 mg/dm$^2$, Zn: 0.01 to 0.5 mg/dm$^2$, Cr: 0.01 to 0.3 mg/dm$^2$.

2. A treated copper foil as set forth in claim 1, wherein a height of projections formed of said roughening particles is 1 to 5 μm and 6 to 35 of said projections are distributed uniformly in a 25 μm surface length of copper foil cross-section observed.

3. A treated copper foil as set forth in claim 1, wherein a maximum width of said projections is at least 0.01 μm and not more than twice of 25 μm divided by the number of projections in a 25 μm surface length of copper foil cross-section observed.

4. A treated copper foil as set forth in claim 1, wherein an untreated copper foil before roughening treatment of said treated copper foil is an electrodeposited copper foil.

5. A treated copper foil as set forth in claim 4, wherein a surface to be roughening treated of an untreated copper foil is a matte side with a surface roughness Rz of not more than 2 μm.

6. A treated copper foil as set forth in claim 4, wherein said electrodeposited copper foil of the surface treated foil comprises granular crystals.

7. A treated copper foil as set forth in claim 6, wherein a surface to be roughening treated of an untreated copper foil is a matte side with a surface roughness Rz of not more than 2 μm.

8. A treated copper foil as set forth in claim 1, wherein a surface roughness Rz of at least one side of surface to be roughening treated of an untreated copper foil before roughening treatment of said treated copper foil is not more than 2 μm.

9. A treated copper foil as set forth in claim 1, wherein projections formed from said roughening particles are formed of Cu particles, Cu and Mo alloy particles or alloy particles of Cu and at least one element selected from a group of Ni, Co, Fe, Cr, V, and W.

10. A treated copper foil as set forth in claim 1, wherein a silane coupling layer is formed on a surface formed on top of the stainproof layer.

11. A treated copper foil as set forth in claim 1, wherein said treated copper foil is a treated copper foil comprising an untreated copper foil on at least one side of which roughening particles are deposited to make said roughening treated surface and an amount of copper or copper alloy deposited on the roughening treated surface is 2.5 to 400 mg/dm$^2$.

12. A treated copper foil as set forth in claim 11, wherein a height of projections formed of said roughening particles is 1 to 5 μm and 6 to 35 of said projections are distributed uniformly in a 25 μm surface length of copper foil cross-section observed.

13. A treated copper foil as set forth in claim 11, wherein a maximum width of said projections is at least 0.01 μm and not more than twice 25 μm divided by the number of the projections in a 25 μm surface length of copper foil cross-section observed.

14. A circuit board formed by using a treated copper foil, wherein the treated copper foil comprises
   a copper foil on at least one side of which roughening particles are deposited to make a roughening treated surface, said roughening treated surface having a surface roughness Rz of 1.5 to 4.0 μm and luminosity of not more than 30,
   wherein a height of projections formed of said roughening particles is 1 to 5 μm and 200 to 25000 of said projections are distributed in a 100 μm×100 μm area, and a surface formed with projections formed from said roughening particles is formed with a stainproof layer in the ranges of Ni: 0.01 to 0.5 mg/dm$^2$, Zn: 0.01 to 0.5 mg/dm$^2$, Cr: 0.01 to 0.3 mg/dm$^2$.

* * * * *

UNITED STATES PATENT AND TRADEMARK OFFICE
CERTIFICATE OF CORRECTION

PATENT NO.       : 7,381,475 B2                                   Page 1 of 1
APPLICATION NO.  : 11/052998
DATED            : June 3, 2008
INVENTOR(S)      : Suzuki It is certified that error appears in the above-identified patent and that said Letters Patent is hereby corrected as shown below:

At column 1, line 63, please delete "hydroscopicity" and insert -- hygroscopicity --, therefore.

At column 2, line 55, please delete "dose" and insert -- does --, therefore.

At column 9, line 2, please delete "sea" and insert -- sec --, therefore.

At column 9, line 8, please delete "sea" and insert -- sec --, therefore.

At column 11-12, line 28, in Table 1, please delete "11160" and insert -- 11150 --, therefore.

Signed and Sealed this

Sixth Day of January, 2009

JON W. DUDAS
*Director of the United States Patent and Trademark Office*